United States Patent [19]

Furuno et al.

[11] Patent Number: 5,615,151
[45] Date of Patent: Mar. 25, 1997

[54] SEMICONDUCTOR INTEGRATED CIRCUIT OPERABLE AND PROGRAMMABLE AT MULTIPLE VOLTAGE LEVELS

[75] Inventors: Takeshi Furuno; Yasuhiro Nakamura, both of Kodaira; Akinori Matsuo, Higashiyamato, all of Japan

[73] Assignees: Hitachi, Ltd.; Hitachi VLSI Engineering Corp., Tokyo, Japan

[21] Appl. No.: 478,334

[22] Filed: Jun. 7, 1995

Related U.S. Application Data

[63] Continuation of Ser. No. 893,802, Jun. 4, 1992, Pat. No. 5,444,663.

[30] Foreign Application Priority Data

Jul. 2, 1991 [JP] Japan .................................... 3-188109

[51] Int. Cl.$^6$ ........................................................ G11C 8/00
[52] U.S. Cl. ................................. 365/185.18; 365/185.21; 365/226
[58] Field of Search ........................ 365/185.18, 185.21, 365/189.09, 226, 227, 228, 189.03

[56] References Cited

U.S. PATENT DOCUMENTS

| 4,585,955 | 4/1986 | Uchida ................................. 365/226 X |
| 4,806,789 | 2/1989 | Sakihama et al. ................... 365/226 X |
| 5,046,052 | 9/1991 | Miyaji et al. ............................. 365/226 |
| 5,153,854 | 10/1992 | Herold ................................. 365/185.18 |

FOREIGN PATENT DOCUMENTS

| 63-108594 | 12/1986 | Japan . |
| 61-294929 | 5/1988 | Japan . |

Primary Examiner—Joseph A. Popek
Attorney, Agent, or Firm—Fay, Sharpe, Beall, Fagan, Minnich & McKee

[57] ABSTRACT

Any one of the internal circuits of a semiconductor integrated circuit is made to operate both at a relatively high operating voltage having a predetermined allowable range and at a relatively low operating voltage also having a predetermined allowable range. The operating voltage is supplied from the outside. Moreover, the operating conditions of the internal circuits constituting the semiconductor integrated circuit are individually set restrictive to the relatively high operating voltage having a predetermined allowable range and to the relatively low operating voltage having a predetermined allowable range. The semiconductor integrated circuit is made to operate selectively at these operating voltages. Since the internal circuits are operated at these two kinds of operating voltages, an arrangement of internal circuits can be simplified and at the same time the semiconductor integrated circuit is usable in not only the conventional system but also a low-voltage one. Moreover, an operating method of the sort that conforms to specifications restrictive to both the relatively high operating voltage as used in the conventional system and the low-voltage system renders extendable a range of uses of such a semiconductor integrated circuit simple in construction.

22 Claims, 8 Drawing Sheets

SEMICONDUCTOR INTEGRATED CIRCUIT OPERABLE AND PROGRAMMABLE AT MULTIPLE VOLTAGE LEVELS

This application is a continuation of U.S. Ser. No. 07/893,802, filed Jun. 4, 1992, now U.S. Pat. No. 5,444,663.

BACKGROUND OF THE INVENTION

The present invention relates generally to semiconductor integrated circuits and methods of operating semiconductor integrated circuits, and more particularly to technology effectively applicable to EPROM (Erasable & Programmable Read Only Memory) from which data can be read at low operating voltage and what permits any general purpose writer to write data thereto.

As nonvolatile memory units, there are EPROMs from which stored data can be erased under ultraviolet rays. Data is written by a programmer (writer) to EPROM and erased by the irradiation of ultraviolet rays. EPROM has been designed to operate at a supply voltage of 5 V. When an existing general purpose writer is fitted to EPROM for the purpose of writing data, a supply voltage of 5 V to 6 V is supplied from the general purpose writer to the EPROM and a high voltage for writing is also supplied from the general purpose writer to the EPROM. Japanese Patent Laid-Open No. 108594/1988 discloses an exemplary EPROM having a circuit for appropriate writing operations to be performed by detecting such a high voltage for writing.

SUMMARY OF THE INVENTION

The present inventors have called attention to the fact that the operating voltage of a semiconductor integrated circuit of the sort stated above tends to become lowered to 3 V, for instance, in order to increase system operating speed and to reduce power consumption, and have explored the possibility of developing EPROM capable of operating at such a low voltage. Although it is relatively simple to lower the operating voltage to 3 V, there arises a problem of developing a newly-required writer, that is, what is intended for low voltage use as any existing writer is not usable. Therefore, the present inventors have further explored the possibility of developing EPROM which allows data to be written by a general purpose writer and is capable of operating in a low voltage system. As far as EPROM capable of operating at only two operating voltages is concerned, the operating conditions of the internal circuit can be made less severe than a case where the operation has to be performed in a wide range of voltages, e.g., 5 V to 3 V. Moreover, the present inventors have found that as a method of operating such an semiconductor integrated circuit, it is more practical and pragmatic.

An object of the present invention is to provide a novel semiconductor integrated circuit for simultaneous use in not only a conventional but also a low voltage system quite simple in configuration and a method of operating such a semiconductor integrated circuit.

Another object of the present invention is to provide EPROM which allows data to be written by any existing general purpose writer and is capable of operating at a relatively low voltage.

These and other objects, and novel features of the present invention will become more apparent as the description proceeds, when considered with the accompanying drawings.

A brief description will subsequently given of a typical disclosure of the present invention. The internal circuit of a semiconductor integrated circuit is made to operate both at a relatively high operating voltage having a predetermined allowable range and at a relatively low operating voltage having a predetermined allowable range, the voltages being supplied from the outside. Moreover, the operating conditions of the internal circuit incorporated in the semiconductor integrated circuit are individually set to those restrictive to two at the relatively high operating voltage having a predetermined allowable range and at the relatively low operating voltage having a predetermined allowable range, the voltages being supplied from the outside. These two operating voltages are selectively used to operate the semiconductor integrated circuit.

With the above-mentioned means, the internal circuit can be configured as simple as possible since it is only necessary for the internal circuit to operate in response to the two kinds of operating voltages, so that a semiconductor integrated circuit usable in either of the two systems can be obtained; namely, a conventional system and a low voltage system. Moreover, a semiconductor integrated circuit simpler in construction may be made usable in a wider range by restricting the operating voltage to two; that is, a relatively high operating voltage for use in any conventional system and a low voltage for use in a lower voltage system and by adopting an operating method wherein specifications are determined accordingly.

DESCRIPTION OF THE PREFERRED EMBODIMENTS

Figure 1:
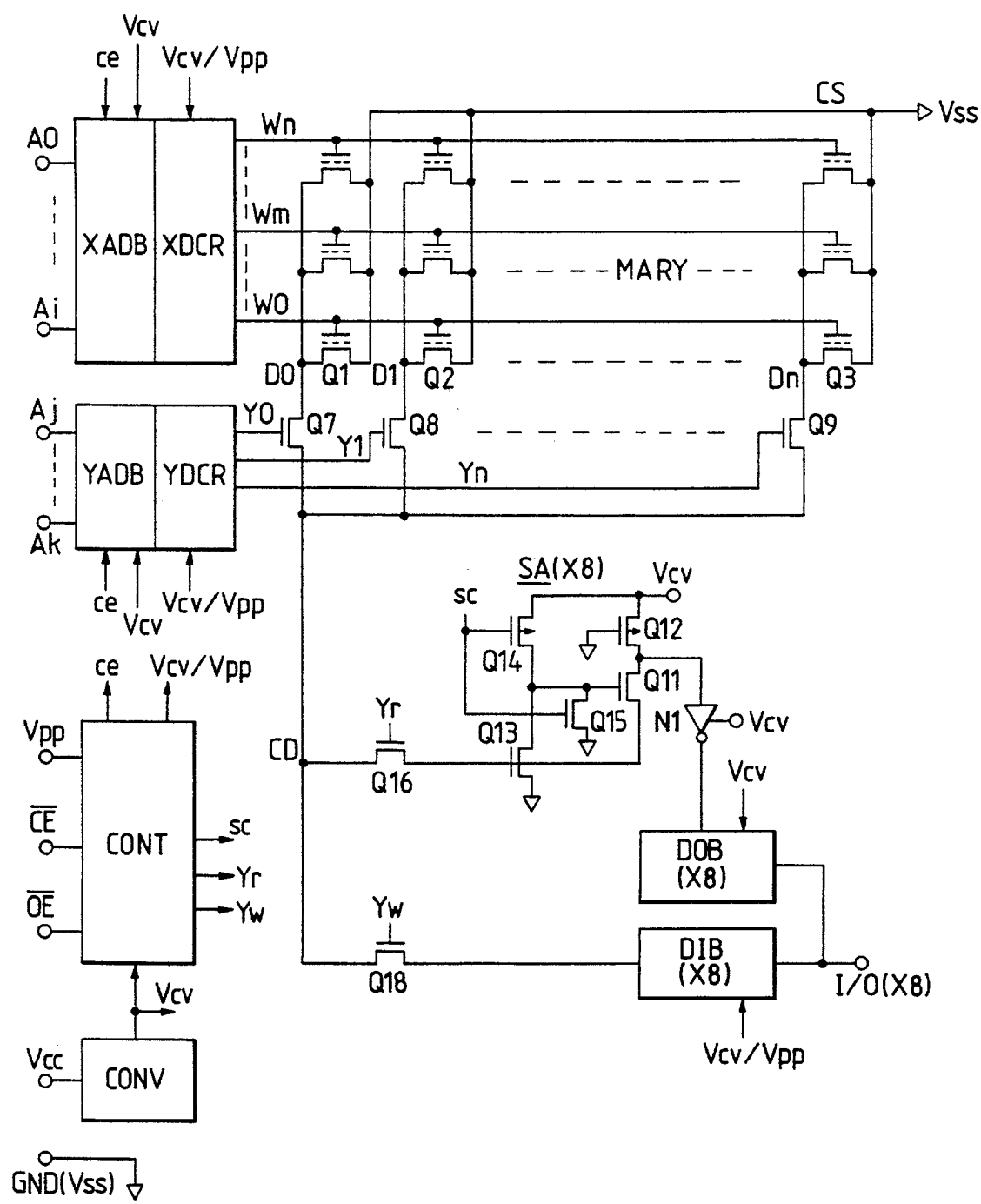
FIG. 1 is a block diagram of EPROM embodying the present invention.

FIG. 1 is a block diagram of EPROM embodying the present invention. Each circuit block shown in FIG. 1 is formed on one semiconductor substrate of monocrystalline silicon through the process of manufacturing a known CMOS semiconductor integrated circuit, though not necessarily restricted to this process thereof.

P-channel MOSFETs whose channels (its substrate gate portion) are marked with arrows are distinguished from N-channel MOSFETs without arrows. The same will apply to the drawings that follow.

Each circuit block is formed on a semiconductor substrate made of monocrystalline P-type silicon, though not necessarily restricted to this. The N-channel MOSFET comprises a source and a drain region formed on the surface of the semiconductor substrate, and a gate electrode of polysilicon, for instance, formed via a thin gate insulating film on the surface of the semiconductor substrate between the source and drain regions. The P-channel MOSFET is formed in an N-type well region formed on the semiconductor substrate. In this way, the semiconductor substrate constitutes a common substrate gate of the plurality of N-channel MOSFETs formed thereon and is supplied with the ground potential of the circuits. The N-type well region constitutes the substrate gate of the P-channel MOSFET formed thereon. The substrate gate of the P-channel MOSFET, that is, the N-type well region is coupled to internal constant voltage Vcv as will be described later. However, the N-type well region forming the substrate gate in an input circuit for receiving a signal level corresponding to power supply voltage Vcc supplied from the outside or the circuit operated by the voltage Vcc is coupled to the voltage Vcc. In the case of a circuit dealing with high voltage, moreover, the high voltage supplied from the outside or what is internally generated is coupled to the N-type well region where the P-channel MOSFET dealing with the high voltage is formed. Needless to say, each of the circuit blocks may be formed on a semiconductor substrate of monocrystalline N-type silicon. In this case, the N-channel MOSFET and a nonvolatile memory cell are formed in a P-type well region and the P-channel MOSFET is formed on the N-type semiconductor substrate.

In EPROM of this embodiment, X address signals AO–Ai and Y address signals Aj–Ak supplied from the outside via external terminals marked with 0 are input to an X address buffer XADB and a Y address buffer YADB, respectively. Internal address signals formed by the address buffers XADB, YADB on the basis of the X and Y address signals are supplied to an X address decoder XDCR and a Y address decoder YDCR. The address buffers XADB, YADB whose operation is controlled by control signals ce, though not necessarily restricted to these, are held ON when EPROM is selected. These address buffers operate with the internal constant voltage Vcv as operating voltage.

The X address decoder XDCR operates with the internal constant voltage Vcv and high voltage for writing as operating voltage. The X address decoder XDCR is operated by the high voltage Vpp during the write operation and operated by the internal constant voltage Vcv during the verify/read operation. The X address decoder XDCR forms a selection signal in conformity with the internal address signal supplied from the corresponding address buffer XADB. A word line WO, Wm or Wn of a memory array MARY is selected by the selection signal conforming to the internal address signal. The Y address decoder YDCR, like the X address decoder XDCR, operates with the internal constant voltage Vcv and high voltage for writing as operating voltage. The Y address decoder YDCR is operated by the high voltage Vpp during the write operation and operated by the internal constant voltage Vcv during the verify/read operation. The Y address decoder YDCR forms selection signals YO, Y1 . . . Yn in conformity with the internal address signal supplied from the corresponding address buffer YADB. A data line is selected from the memory array MARY.

One representative memory arrayMARY is shown in FIG. 1 by way of example. Exemplarily, the memory array MARY comprises stacked gate type nonvolatile memory elements (nonvolatile memory elements . . . MOSFETQ1–Q3), each having a control gate and a floating gate, the word lines WO . . . Wm . . . Wn and data lines DO . . . D1 . . . Dn. The control gates of the nonvolatile memory cells Q1–Q3 disposed on the same line in the memory array MARY are connected the corresponding word line WO, whereas the drains of the nonvolatile memory cells disposed on the same column are connected the corresponding data lines DO, Dl–Dn, respectively.

The voltage of the word line for data to be written thereto is set by the X address decoder XDCR at the high voltage Vpp. The data line coupled to the memory element with the floating gate into which electrons are injected is set by a data input buffer DIB at the high voltage Vpp likewise. A channel saturating current consequently flows through the memory cell and the electrons accelerated by a high electric field are ionized in a pinch-off area near the drain coupled to the data line, so that electrons having high energy, so-called hot electrons, are generated. On the other hand, the floating gate is set at the voltage determined by the voltage of the control gate coupled to the word line, the drain voltage, the capacity between the substrate and the floating gate, and the capacity between the floating gate and the control gate. The hot electrons are induced to make the potential of the floating gate negative accordingly. The memory cell thus loaded with data is variably set at such a threshold voltage that even when the potential of the word line coupled to the control gate is held at a high selective level as that of the operating voltage Vcv, the memory cell may remain nonconductive. The drain of the memory cell into which no electrons are injected, that is, the potential of the data line is set by the data input buffer DIB at the low level at which no hot electrons are generated in the pinch-off area near the drain. In this way, the memory cell loaded with no data is kept at such a low threshold voltage that even when the potential of the word line coupled to the control gate is held at the high selective level as that of the operating voltage Vcv, the memory cell may remains conductive.

As EPROM of this embodiment is designed for data to be written/read with a plurality of bits, like 8 bits (or 16 bits), as a unit, though not necessarily restricted to this, it is provided with a plurality of memory arrays, e.g., 8 sets (or 16 sets) of them. Part of EPROM for gaining access to memory with 8 bits as a unit is shown in FIG. 1 by way of example; there is shown one memory array with portions relating thereto and those which are not shown therein are similar in configuration to what is illustrated above.

The data lines DO–Dn constituting the one memory array MARY are connected to a common data line CD via column switches MOSFETQ7–Q9 for receiving the column selection signals Yo, Y1–Yn formed by the Y address decoder YDCR. The output terminal of the data input buffer DIB for receiving the writing signal supplied from an external terminal I/O (one of the DO–D7) is connected via a switch MOSFETQ18 to the common data line CD. The remaining seven memory arrays are provided with similar column selective circuit switches MOSFETs, common data lines CDs, an external terminal (one of the DO–D7), and data input buffers DIBs, respectively. The corresponding column selection signal is supplied from the Y address decoder YDCR to each of these switch MOSFET.

The common data line CD correspondingly provided for the memory array forms the input-stage circuit of a sense amplifier via a switch MOSFETQ16 whose switching operation is controlled by a read control signal Yr and is coupled to the input terminal of an initial-stage amplifier circuit as will subsequently be described. A circuit formed with MOSFETQ11–Q15 constituting the initial-stage amplifier circuit and a CMOS inverter circuit N1 is called a sense amplifier SA for convenience. The sense amplifier SA is supplied with the internal constant voltage Vcv as operating voltage.

The exemplary common data line CD shown above is connected via MOSFETQ16 held ON by the read control signal Yr to the source of an N-channel amplifier MOSFETQ11. A P-channel load MOSFETQ12 with the ground potential Vss of the circuit applied to its gate is provided between the drain of the amplifier MOSFETQ11 and the supply voltage Vcv. The load MOSFETQ12 operates to let precharge current flow through the common data line CD to effect the read operation.

In order to increase the sensitivity of the amplifier MOSFETQ11, the voltage of the common data line CD via the switch MOSFETQ16 is supplied to the gate of the drive MOSFETQ13 as the input of an inverted amplifier circuit comprising the N-channel drive MOSFETQ13 and the P-channel load MOSFETQ14. The output voltage of the inverted amplifier circuit is supplied to the gate of the amplifier MOSFETQ11. Moreover, the N-channel MOSFETQ15 is provided between the gate of the amplifier MOSFETQ11 and the ground potential point Vss to prevent current consumption from being wasted during a period of the non-operation of the sense amplifier. A sense amplifier operating timing signal sc is commonly supplied to the gates of this MOSFETQ15 and the P-channel MOSFETQ14.

During the read operation of the memory cell, the sense amplifier operating timing signal sc is held at a low level and MOSFETQ14 is held ON, whereas MOSFETQ15 is held OFF. The memory cell is caused have the high or low threshold voltage with respect to the selective level of the word line as mentioned previously according to write data, that is, the stored data.

In the memory cell selected by the X address decoder XDCR, the common data line CD is set at the high level when supplied with current from MOSFETQ12 and Q11 as viewed from the memory cell held OFF despite the fact the word line is held at the selective level. As viewed from the memory cell held ON by the selective level of the word line, on the other hand, the common data line CD is set by the memory cell thus held ON at the low level.

The above-mentioned high level of the common data line CD is restricted to a relatively low potential when the relatively low-level output voltage formed by the inverted amplifier circuit receiving the high-level potential is supplied to the gate of MOSFETQ11. On the other hand, the above-mentioned low level of the common data line CD is restricted to a relatively high potential when the relatively high-level output voltage formed by the inverted amplifier circuit receiving the low-level potential is supplied to the gate of MOSFETQ11.

By controlling the high and low levels of the common data line CD in that way, an attempt to increase the reading speed can be implemented in spite of the presence of a capacity such as a floating capacity restraining the common data line CD from speeding signal variation. In other words, it is possible to shorten the time required for the potential of the common data line CD to change from one level to the other when data are successively read from the plurality of memory cells. For the high-speed reading operation like this, the conductance of the load MOSFETQ12 is set relatively greater.

The amplifier MOSFETQ11 performs the operation of amplifying a gate-grounding source input and transmits its output signal to the CMOS inverter circuit N1. The CMOS inverter circuit N1 senses the high/low level with the logic threshold voltage as a reference voltage. The CMOS inverter circuit N1 is also supplied with the constant voltage Vcv and the ground voltage Vss as the operating power supply. The output signal of the CMOS inverter circuit N1 is amplified by a corresponding data output buffer DOB, though not necessarily restricted to this, before being sent out of the external terminal I/O. Moreover, the write signal supplied from the external terminal I/O is transmitted via an input buffer DIB to the common data line CD. A similar read circuit comprising the input-stage circuit, the sense amplifier and the data output buffer and a similar write circuit including the data input buffer are provided between the common data line and the external terminal corresponding to any other memory array provided for the ×8 bit or ×16 bit configuration.

The constant voltage Vcv is supplied to the data output buffer DOB as its operating voltage. Although not shown, the ground voltage Vss is also supplied thereto as the operating voltage.

As the operating voltage, the constant voltage Vcv, the high voltage Vpp and the ground voltage Vss (not shown) are also supplied to the data input buffer DIB. The data input buffer DIB supplied with the high voltage Vpp supplies the high or low voltage to the common data line CD in accordance with data to be written during the write operation. The above-mentioned write operation is thus performed.

A control circuit CONT, though not necessarily restricted to the following, generates a control signal corresponding to the operating mode and supplies operating voltage corresponding thereto on receiving a chip enable signal and an output enable signal supplied to an external terminal $\overline{CE}$, $\overline{OE}$ and VPP, the high voltage Vpp, and the internal constant voltage Vcv formed in a voltage conversion circuit CONV. In other words, the control circuit CONT identifies the designated operating mode, depending on the external signals supplied to the external terminals $\overline{CE}$, $\overline{OE}$ and the voltage supplied to the external terminal VPP. The control circuit CONT includes a generation circuit (not shown) for generating control-signals ce, sc in accordance with the operating mode thus identified and a voltage switching circuit (not shown) for switching the operating voltage Vcv/Vpp to be supplied to the address decoders XDCR, YDCR and the data input buffer DIB in accordance with the operating made thus identified. When chip enable signal $\overline{CE}$ and the output enable signal $\overline{OE}$ respectively remain at the low and high levels at the time the high voltage VPP for writing is supplied to the external terminal VPP, the write mode is identified and the internal signal ce is set at the high level. Then the internal constant voltage Vcv corresponding to the high voltage VPP is supplied to the address decoder circuits XDCR, YDCR and the data input buffer DIB as their operating voltage. The word line coupled to the memory cell to be loaded with data is set at the high voltage Vpp. The data line coupled to the memory cell with the floating gate into which electrons are injected is also set at the high voltage Vpp. As a result, a channel saturating current flows through the memory cell and the electrons accelerated by a high electric field are ionized in the pinch-off area near the drain coupled to the data line, so that electrons having high energy, so-called hot electrons, are generated. On the other hand, the floating gate in the memory cell is set at the voltage determined by the voltage of the control gate coupled to the word line, the drain voltage, the capacity between the substrate and the floating gate, and the capacity between the floating gate and the control gate. The hot electrons thus generated are induced to make the potential of the floating gate negative accordingly. The memory cell remains non-conductive even when the potential of the word line coupled to the control gate is held at the selective level. On the other hand, the low-level voltage causing no hot electrons to be generated in the pinch-off area near the drain is applied to the drain of the memory cell into which no electrons are injected.

When the chip enable signal $\overline{CE}$ and the output enable signal $\overline{OE}$ respectively remain at the low and high levels at the time the high voltage VPP for writing is supplied to the external terminal VPP, the designation of the verify mode is identified and the internal signals sc, ce are set at the high level. In this verify mode, the operating voltage of the address decoders XDCR, YDCR and the data input buffer DIB is switched from the high voltage Vpp to the internal voltage Vcv, whereby the memory cell is selected for the reading of the stored data.

When the voltage applied to the external terminal VPP is not the high voltage Vpp necessary for writing, that is, when the voltage is in a state of floating or the ground potential, or what is supplied from the outside at the level Vcc, the chip enable signal $\overline{CE}$ and the output enable signal $\overline{OE}$ are respectively set at the low and high levels, and the designation of the read mode is identified. The internal signals are set at the high level. In this case, moreover, the operating voltage of the address decoders XDCR, YDCR and the data input buffer is switched to the internal voltage Vcv, whereby the memory cell is selected for the reading of the stored data. When the sort and verify modes are designated, the read control signal Yr is output from the control circuit CONT and when the write (program) mode is designated, the write control signal Yw is also output from the control circuit CONT. In this case, some of the Y address signals Yj–Yk are supplied to the control circuit CONT so that selection may further be made by the switches Q16, Q18.

When the supply voltage Vcc supplied from the outside via the external terminal has a predetermined allowable range of about 5 V±0.5 Vand is a relatively high voltage, it is converted by the voltage conversion circuit CONV to an internal constant voltage Vcv of about 3 V and that internal constant voltage Vcv is used as the operating voltage of the internal circuit. The voltage conversion circuit CONV has a voltage switching function, though not necessarily restricted to this function, and when the supply voltage Vcc supplied from the outside has a predetermined allowable range of about 3 V±0.3 V and is relatively low voltage, it directly outputs the external voltage Vcc as the internal voltage Vcv. With this arrangement, the internal circuits of the decoders XDCR, YDCR and the sense amplifier SA are operated at the substantially same voltage even though the voltage supplied from the outside is the relatively high or low voltage as noted above. As a result, the operating conditions of the internal circuits are equalized and the power consumption as well as the operating speed is also equalized in spite of two kinds of supply voltages supplied from the outside. In the case of the sense amplifier SA, the same reference voltage can be used for sensing.

With this arrangement, the existing general purpose writer (programmer) may be used for writing in EPROM of this embodiment, which is also usable likewise in any system having operating voltage of both 5 V and 3 V series. Consequently, a range of uses is extendable and mass producibility is also improvable on the part of EPROM manufacturers, whereas system designing is facilitated while the trouble of controlling assembly parts is obviated as users are allowed to use EPROM in any system of both 5 V and 3 V series.

Figure 2:
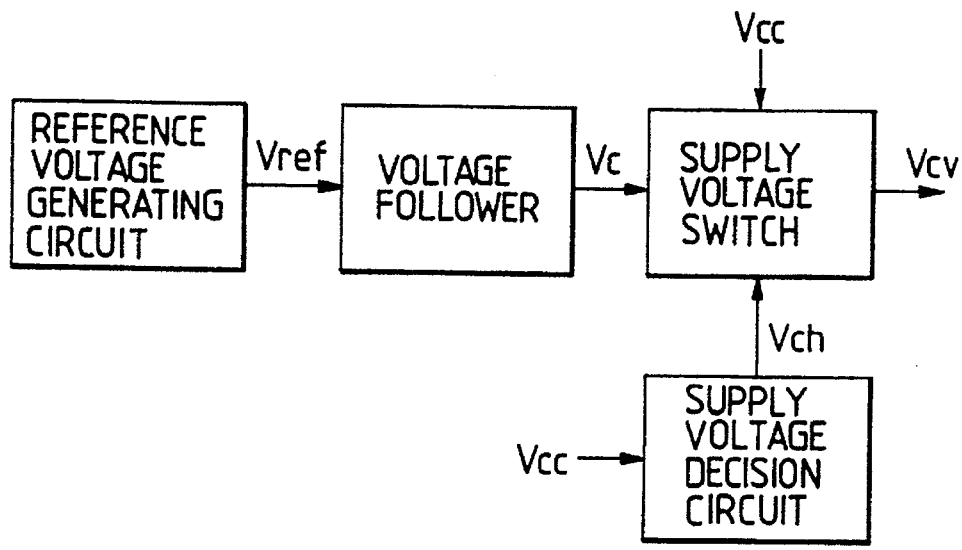
FIG. 2 is a block diagram illustrating the voltage conversion circuit CONV of FIG. 1.

FIG. 2 is a block diagram of a voltage conversion circuit embodying the present invention.

A reference voltage generating circuit forms a reference voltage Vref. The reference voltage Vref is a constant voltage Vc corresponding to the operating voltage Vcv at about 3 V. On receiving the reference voltage Vref, a voltage follower subjects the reference voltage Vref to power amplification so as to form the internal voltage Vc. The internal constant voltage Vc is supplied to a supply voltage switch, though not necessarily restricted to this. The supply voltage Vcc supplied from the outside is also input to the supply voltage switch. A supply voltage decision circuit decides the supply voltage Vcc supplied from the external terminal Vcc and forms a decision signal Vch. The decision signal Vch is used as a switching control signal of the supply voltage. When the supply voltage Vcc supplied from the outside is relatively as high as about 5 V, the supply voltage switch outputs the internal constant voltage Vc as the internal operating voltage Vcv and when it is relatively as low as about 3 V, the supply voltage switch directly outputs the supply voltage Vcc supplied from the outside in place of the internal constant voltage Vc as the operating voltage Vcv. Since the internal constance voltage Vc is not formed with stability as the operating voltage of the reference voltage generating circuit and the voltage follower is in short supply when the supply voltage Vcc supplied from the outside is relatively as low as about 3 V, the supply voltage Vcc supplied from the external terminal is directly used as the internal operating voltage Vcv.

When the supply voltage Vcc supplied from the outside is determined at about 5 V or 3 V in this embodiment, the operating voltage Vcv of the internal circuit may be set at as low as about 2 V to operate it. In this case, the supply voltage switch can be dispensed with. This is because even when the supply voltage Vcc supplied from the outside is as low as 3 V, the reference voltage generating circuit and the voltage follower are allowed to form a constant voltage of 2 V stably with the supply voltage as the operating voltage. With the omission of the supply voltage switch, the supply voltage decision circuit can also be dispensed with accordingly.

Figure 3:
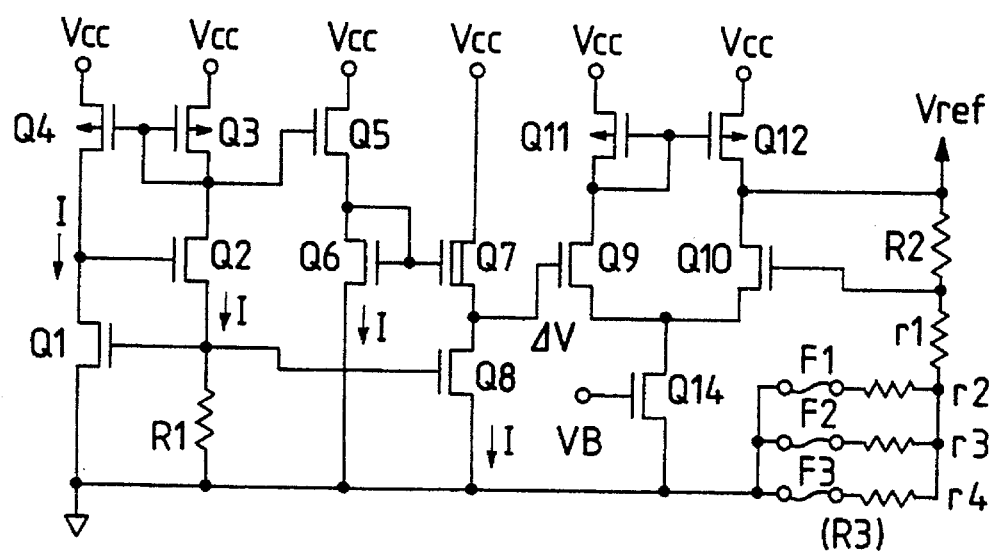
FIG. 3 is a specific circuit diagram of the reference voltage generating circuit of FIG. 2.

FIG. 3 is a specific circuit diagram of the reference voltage generating circuit. Although some of the reference characters given to the circuit elements of FIG. 1 are repeatedly used in FIG. 3 to obviate complication, it should be understood that each of them has a different circuit function. This applies to other circuits that follow thereafter.

A resistor R1 is so arranged as to have a large resistance value with respect to the supply voltage Vcc and used to form a constant current I of, for instance, 10 nA (nanoamperes). The constant current I is supplied via an N-channel MOSFETQ2 and a P-channel MOSFETQ3 in the form of a diode. P-channel MOSFETQ4 and Q5 in the form of a current mirror are provided with the gate and source in common with the P-channel MOSFETQ3. An N-channel MOSFETQ1 is connected to the drain of MOSFETQ4 in series. The constant voltage formed by the resistor R1 is supplied to the gate of this MOSFETQ1, whereat the drain of MOSFETQ1 is connected to the gate of MOSFETQ2. A feedback loop is thus formed with MOSFETQ1 and Q2 so as to stabilize the constant current I formed by the resistor R1.

The constant current I formed by MOSFETQ5 is supplied to an N-channel MOSFETQ6 in the form of a diode. This MOSFETQ6 is an enhancement type. The threshold voltage between the gate and source of MOSFETQ6 is supplied to the gate of a depression N-channel MOSFETQ7. An N-channel MOSFETQ8 for receiving the constant voltage formed by the resistor R1 is provided on the source side of MOSFETQ7. The constant current I is caused to flow through MOSFETQ8 like MOSFETQ1. Consequently, the same constant current I flows through MOSFETQ6 and Q7 and the differential voltage ΔV between the threshold voltages of MOSFETQ6 and Q7 is produced from the source of MOSFETQ7. As the threshold voltage of the depression MOSFETQ7 is negative in value, the voltage different ΔV is equivalent to the voltage obtained by adding the absolute value of the threshold voltage of MOSFETQ7 to that of MOSFETQ6.

A differential amplifier circuit to be arranged comprises an active load circuit including N-channel differential MOSFETQ9 and Q10 and P-channel MOSFETQ11 and Q12 in the form of a current mirror provided on the drain side of the differential MOSFETQ9 and Q10, and a constant current MOSFETQ14 provided at the common source of the differential MOSFETQ9 and Q10 and used for receiving constant current VB. The constant voltage ΔV is supplied to the gate of MOSFETQ9 as the non-inverted input of the differential amplifier circuit. A gain-setting resistor circuit is connected to the drain of MOSFETQ10 as the output of the differential amplifier circuit and the gate of MOSFETQ10 as its inverted input. The resistor circuit comprises resistors R2, R3. The resistor R3 represents the combined resistance of series-parallel resistors r1–r4 and parallel resistors r2–r4 connected to the resistor r1 in series are provided with fuse means F1–F3 and the trimming of the combined resistance value of the resistor R3 is carried out by selectively cutting these fuse means. The resistance ratio of the resistor R2 to the combined resistor R3 in accordance with the trimming of the resistance value by means of the fuses is used to adjust the gain of the differential amplifier circuit. Process variations with respect to the constant voltage ΔV are thus compensated for and the reference voltage Vref output via the differential amplifier circuit is set at, for instance, 3 V as a desired constant voltage Vc.

Figure 4:
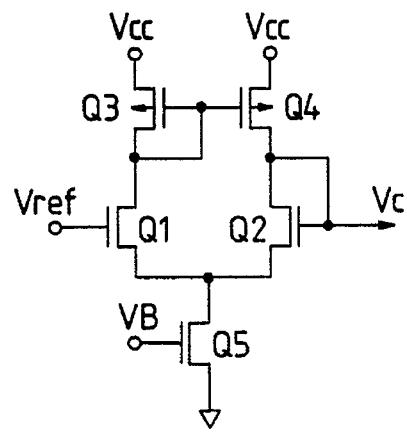
FIG. 4 is a specific circuit diagram of the voltage follower of FIG. 2.

FIG. 4 is a specific circuit diagram of the voltage follower.

A differential amplifier circuit to be also arranged comprises an active load circuit including N-channel differential MOSFETQ1 and Q2 and P-channel MOSFETQ3 and Q4 in the form of a current mirror provided on the drain side of the differential MOSFETQ1 and Q2, and a constant current MOSFETQ5 provided at the common source of the differential MOSFETQ1 and Q2 and used for receiving the constant current VB. The reference voltage Vref is supplied to the gate of MOSFETQ1 as the non-inverted input of the differential amplifier circuit. The drain of MOSFETQ2 as the output of the differential amplifier circuit and the gate of MOSFETQ2 as the inverted input are commonly connected, so that the output signal of the differential amplifier circuit is 100% fed back to the inverted input. Consequently, the output voltage Vc becomes constant voltage equal to the reference voltage Vref thus received.

Figure 5:
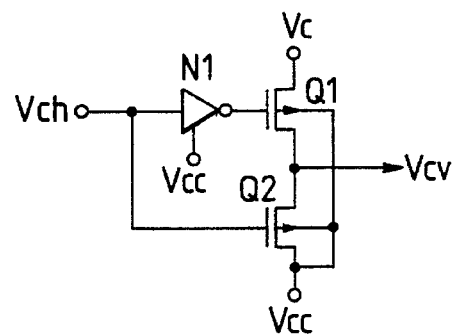
FIG. 5 is a specific circuit diagram of the supply voltage switch of FIG. 2.

FIG. 5 is a specific circuit diagram of the supply voltage switch.

The internal constance voltage Vc formed by the voltage follower is input to the source of P-channel MOSFETQ1. When MOSFETQ1 is formed in an N-type well region, the well potential, that is, the channel potential is set at the supply voltage Vcc supplied from the outside. The supply voltage Vcc supplied from the outside is input to the source of P-channel MOSFETQ2. When MOSFETQ2 is formed in an N-type well region, the well potential is also set at the supply voltage Vcc supplied from the outside. The decision signal Vch is supplied to the gate of MOSFETQ1 on one hand, and to the gate of MOSFETQ2 via an inverter circuit N1 on the other.

When the supply voltage Vcc is as high as about 5 V, the decision signal Vch is set at a high level corresponding to the supply voltage Vcc. The output signal of the inverter circuit N1 receiving the decision signal Vch at such a high level is set at the low level and turns on the P-channel MOSFETQ1. In response to the ON-state of the P-channel MOSFETQ 1, the internal constant voltage Vc is output as the internal voltage Vcv. At this time, MOSFETQ2 is turned off because of the high level of the decision signal Vch. When the supply voltage Vcc is as low as about 3 V, the decision signal Vch is set at the low level like the ground potential Vss. The output signal of the inverter circuit N1 receiving the decision signal Vch at such a low level is set at the high level and turns off the P-channel MOSFETQ1. The P-channel MOSFETQ2 is held ON in conformity with the low level of the decision signal Vch. The supply voltage Vcc is output as the internal voltage Vcv in accordance with the ON-state of the P-channel MOSFETQ2.

Figure 6:
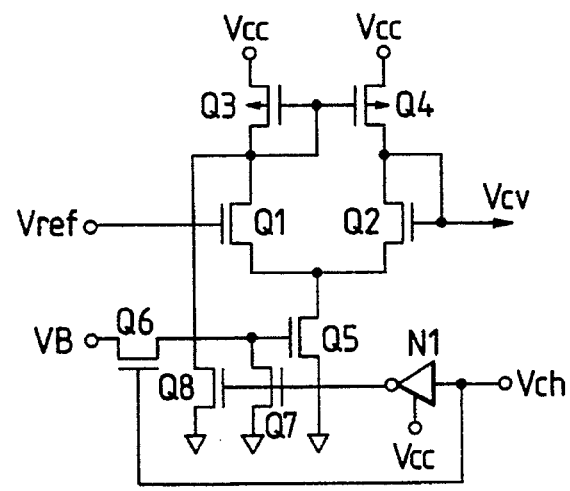
FIG. 6 is another specific circuit diagram of the voltage follower.

FIG. 6 is another specific circuit diagram of the voltage follower.

The voltage follower of this embodiment is additionally provided with the above-mentioned supply voltage switching function. More specifically, the P-channel MOSFETQ4 in the form of a current mirror is used as a supply voltage changeover switch in the voltage follower of FIG. 4. A switch MOSFETQ8 is provided between the gate of MOSFETQ4 and the ground potential of the circuit for the purpose. Moreover, a switch MOSFETQ7 is provided between the gate of a constant current MOSFETQ5 and the ground potential of the circuit. The output signal of inverter circuit N1 receiving the decision signal Vch is supplied to the gates of these switch MOSFETQ7, QS. Further, constant voltage VB is supplied via a switch MOSFETQ6 to the gate of MOSFETQ5. The decision signal Vch is supplied to the gate of the switch MOSFETQ6. As the remaining arrangement of the voltage follower is similar to what is shown in FIG. 4, the description thereof will be omitted. Of the P-channel MOSFETQ3 and Q4 in the form of a current mirror, the conductance is set relatively large to used MOSFETQ 4 on the output side is used as the supply voltage switch and the conductance of MOSFETQ3 is set larger likewise accordingly.

As set forth above, when the supply voltage Vcc is as high as about 5 V, the decision signal Vch is set at a high level corresponding to the supply voltage Vcc. The output signal of the inverter circuit N1 receiving the decision signal Vch at such a high level is set at the low level and turns off N-channel switch MOSFETQ7 AND Q8, whereas an N-channel switch MOSFETQ6 receiving the decision signal Vch at the high level is turned on. Therefore, a constant current MOSFETQ5 performs the constant current operation and the P-channel MOSFETQ3 and Q4 in the form of a current mirror act as an active load circuit. As a result, the differential amplifier circuit is activated and forms and output the operating voltage Vcv corresponding to the reference voltage Vref. When the supply voltage Vcc is as low as about 3 V, on the other hand, the decision signal Vch is set at the low level like the ground potential. The output signal of the inverter circuit N1 receiving the decision signal Vch at such a low level is set at the high level and the N-channel switch MOSFETQ7 and Q8 are turned on, whereas the N-channel switch MOSFETQ6 receiving the decision signal Vch at the low level is turned off. Consequently, the constant current MOSFETQ5 is turned off and the operating current of the differential amplifier circuit is cut off and the amplifying operation is suspended. The P-channel MOSFETQ4 is turned on in accordance with the ON-state of MOSFETQ8 and the supply voltage Vcc is output as the internal voltage Vcv. Although the P-channel MOSFETQ3 is also turned on, it prevents d.c. current from flowing toward the ground potential of the circuit as the constant current MOSFETQ5 is held OFF. With this arrangement, it is possible to simplify the whole circuit as the voltage follower has the supply voltage switching function.

Figure 7:
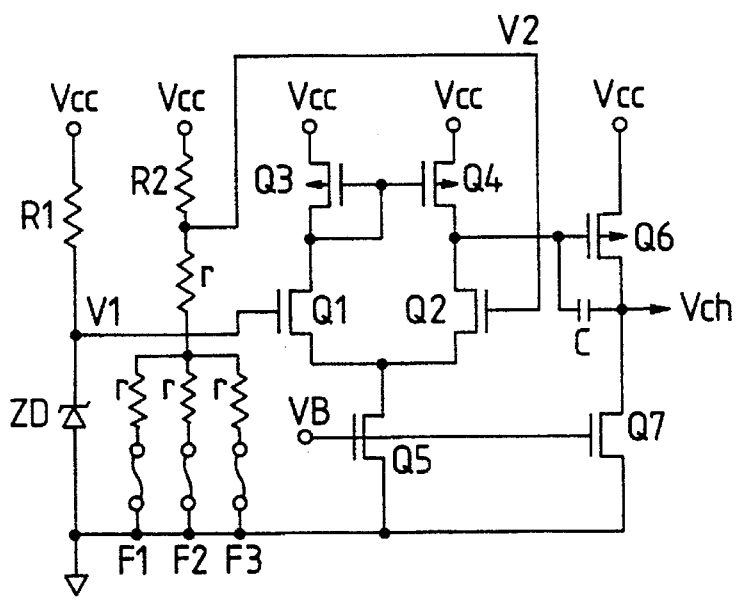
FIG. 7 is a specific circuit diagram of the supply voltage decision circuit of FIG. 2.

FIG. 7 is a specific circuit diagram of the supply voltage decision circuit.

A resistor R1 and a Zener diode ZD forms a reference constant voltage V1 corresponding to the Zener voltage of the Zener diode ZD. A resistor R2 and a resistor circuit relying on series/parallel resistance r like the resistance trimming circuit of FIG. 3 constitute the voltage divider circuit of the supply voltage Vcc. In other words, the divided voltage V2 is produced from the connection between the resistor R2 and the series/parallel resistor circuit. In the above-mentioned resistor circuit, fuse means F1–F3 are provided for the respective parallel resistors r and when the fuse means are selectively cut, process variations are compensated for and the detecting voltage is set.

The constant voltage V1 and the divided voltage V2 are supplied to differential MOSFETQ1 and Q2. P-channel load MOSFETQ3 and Q4 in the form of a current mirror is provided on the drain side of the differential MOSFETQ1 and Q2, whereas a constant current MOSFETQ5 receiving the constant voltage VB is provided on the source side thereof.

Though not necessarily restricted to the following, an inverted output circuit comprising a P-channel output MOSFETQ6 and an N-channel constant current MOSFETQ7 is provided in the differential circuit thus arranged. The drain output signal of the differential MOSFETQ2 is supplied to the gate of the P-channel output MOSFETQ6, whereas the constant voltage VB is supplied to the gate of the constance current MOSFETQ7. In this case, a phase-compensating capacitor C is provided between the gate and drain of the output MOSFETQ6 and the decision signal Vch is output from the drain of MOSFETQ6.

Figure 8:
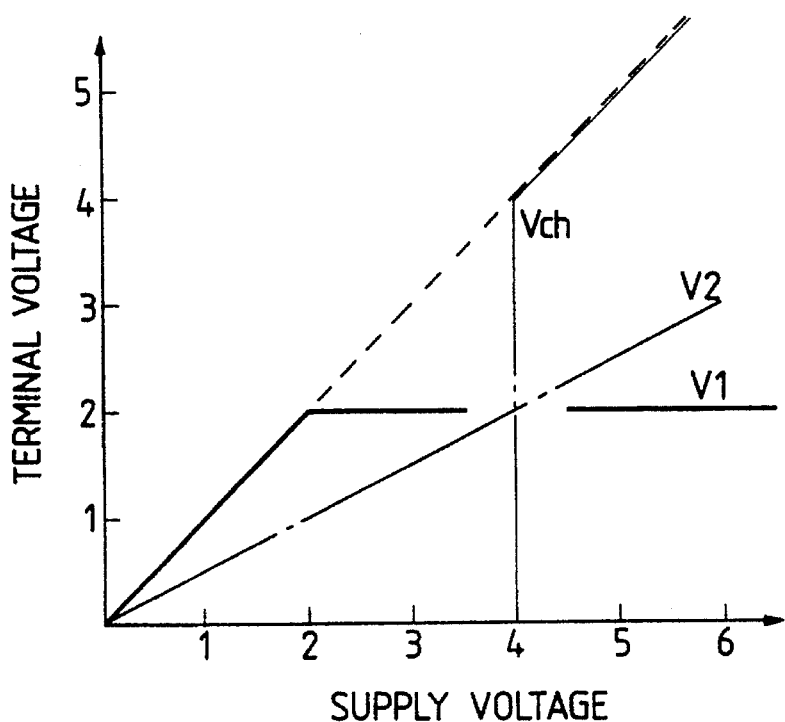
FIG. 8 is a voltage characteristic graph illustrating the operation of the supply voltage decision circuit of FIG. 7.

FIG. 8 is a voltage characteristic graph illustrating the operation of the supply voltage decision circuit.

Since the Zener diode ZD is held OFF in an area where the supply voltage Vcc is lower than the Zener voltage, the constant voltage V1 rises as the supply voltage Vcc rises. In an area where the supply voltage Vcc is higher than the Zener voltage, the constant voltage circuit operates to form the constant voltage V1 corresponding to the Zener voltage. On the other hand, the divided voltage V2 of the supply voltage Vcc rises in proportion to the resistance ratio of the resistor circuit as the supply voltage Vcc rises. Under the supply voltage Vcc where the divided voltage V2 decreases with respect to the constant voltage V1, the output signal of the differential circuit corresponding to the supply voltage is set at the high level, the decision signal Vch that has been inverted and amplified is set at the low level like the ground potential of the circuit. Under the supply voltage Vcc where the divided voltage V2 increases with respect to the constant voltage V1, the output signal of the differential circuit corresponding to the supply voltage is set at the low level, the decision signal Vch that has been inverted and amplified is set at the high level like the supply voltage Vcc. The resistance ratio of the division resistance circuit is set so that the decision signal Vch changes from the low to high level when the supply voltage Vcc is set higher than about 4 V in this embodiment. In this way, it is possible to distinguish between the voltage relatively high at 5 V and what is at 3 V. for instance.

Figure 9:
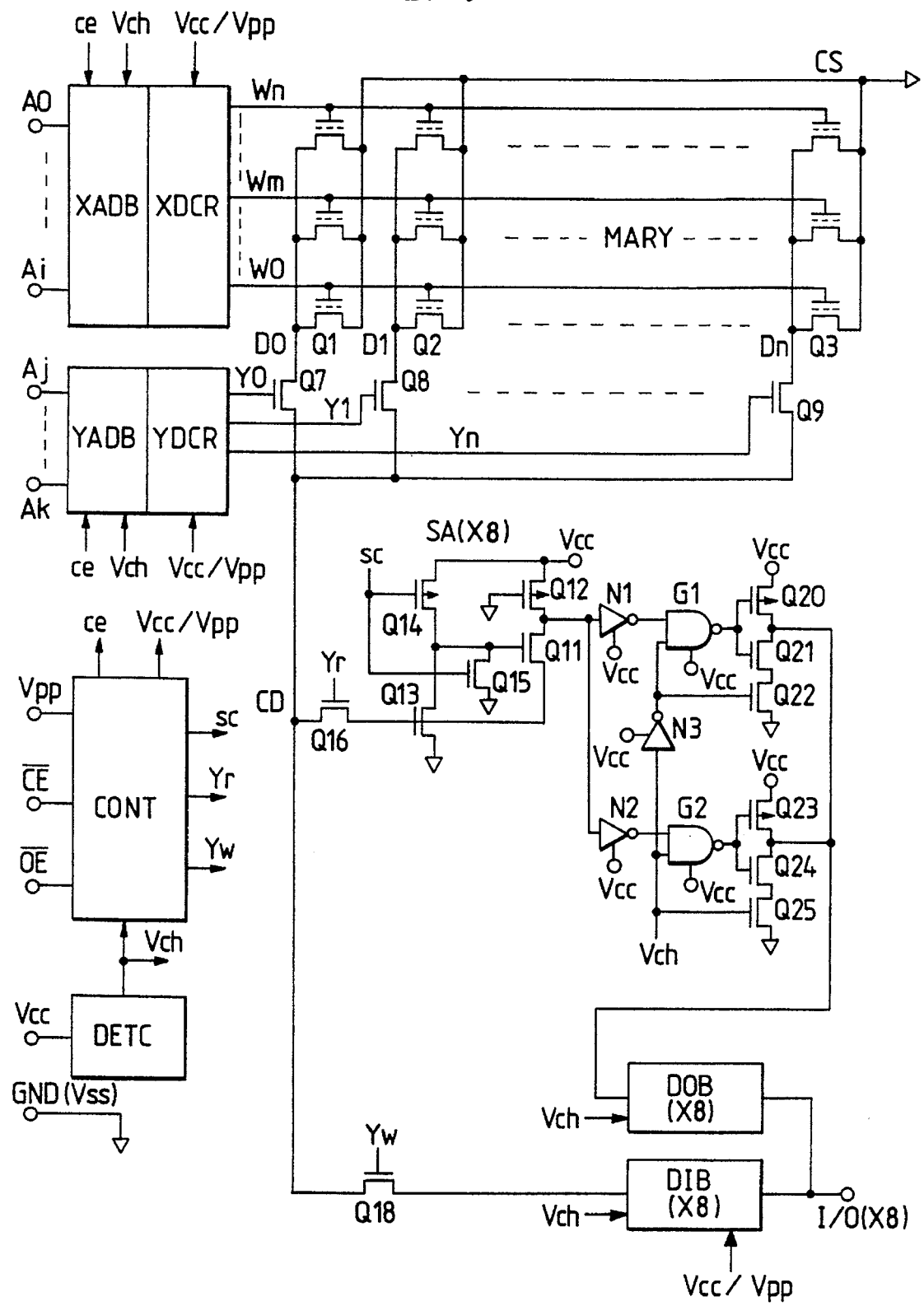
FIG. 9 is a block diagram of another EPROM embodying the present invention.

FIG. 9 is a block diagram of another nonvolatile storage unit embodying the present invention. EPROM of this embodiment is basically similar to what is shown in FIG. 1 and what makes this different from the latter embodiment will be described in detail.

In EPROM of this embodiment, the supply voltage Vcc supplied from the outside via the external terminal Vcc is directly sued as the operating voltage of the internal circuit. Therefore, the operating voltage of the internal circuit greatly differ when the supply voltage Vcc is relatively as high as about 5 V and relatively as low as about 3 V. As a result, the decision signal Vch based on the supply voltage Vcc is supplied to the X address buffers XADB, YADB for receiving address signals AO–Ai, Aj–Ak from the outside and as will be described later, two kinds of input circuits are alternatively used on the basis of the decision signal Vch.

The output signal level of the initial-stage amplifier circuit constituting the sense amplifier SA greatly varies with the two kinds of supply voltages. In order to perform the sensing operation at the signal level corresponding to the each supply voltage, there are provided inverter circuits N1, N2 having two logic threshold voltages and an output selection circuit for selecting the output of the inverter circuit. The logic threshold voltage of the inverter circuit N1 is set at what corresponds to an amplification signal when the supply voltage Vcc is relatively as low as about 3 V. On the other hand, the logic threshold voltage of an inverter circuit N2 is set at what corresponds to an amplification signal when the supply voltage Vcc is relatively as high as about 5 V.

The output signal of the inverter circuit N1 is supplied via an NAND gate circuit G1 to the gates of P-channel MOSFETQ20 and N-channel MOSFETQ21 constituting a CMOS inverter circuit. The source of the N-channel MOSFETQ21 of the CMOS inverter circuit is connected via a switch MOSFETQ22 to the ground potential Vss. The output signal of the inverter circuit N2 is supplied via an NAND gate circuit G2 to the gates of P-channel MOSFETQ23 and N-channel MOSFETQ24 constituting a CMOS inverter circuit. The source of the N-channel MOSFETQ24 of the CMOS inverter circuit is connected via a switch MOSFETQ25 to the ground potential. The decision signal Vch is supplied to the other input of the NAND gate circuit G2 corresponding to the inverter circuit N2 and to the gate of the switch MOSFETQ25. The decision signal Vch is inverted by an inverter circuit N3 before being supplied to the other input of the NAND gate circuit G1 corresponding to the inverter circuit N1 and to the gate of the switch MOSFETQ22.

In the data output buffer DOB, the output circuit is switched by the decision signal Vch as the current drive capability is equalized even when the operating voltage is switched. As in the case of the address buffer, the data input level varies with the case where the voltage is relatively as high as 5 V or relatively as low as 3 V. In conformity with this situation, two input circuits are provided in the data input buffers DIB and the input interface is switched on the basis of the decision signal Vch. In comparison with the embodiment of FIG. 1, the voltage conversion circuit CONV is eliminated and the decision signal Vch is formed by a supply voltage decision circuit DETC similarly configured to the supply voltage decision circuit of FIG. 7.

Figure 10:
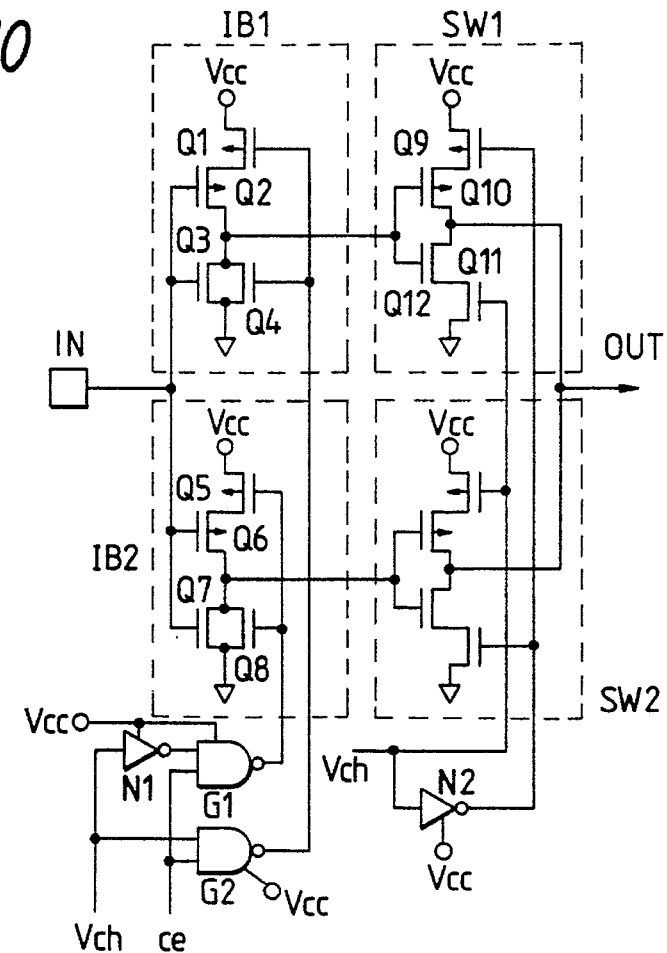
FIG. 10 is a specific circuit diagram of an input buffer for use in EPROM of FIG. 9.

FIG. 10 is a specific circuit diagram of an input buffer for receiving an input signal from the address buffers XADB, YADB, the data input buffer DIB and the like.

There are provided two input buffers IB1, IB2 with respect to an input terminal IN. The input buffer IB1 has a NOR gate circuit comprising serial P-channel MOSFETQ1, Q2 and parallel N-channel switch MOSFETQ3, Q4 and an element constant is selected for MOSFETQ1–Q4 in such a way that they have a logic threshold voltage corresponding to the level of the input signal when the supply voltage Vcc is relatively as high as about 5 V. On the other hand, the input buffer IB2 has a NOR gate circuit comprising serial P-channel MOSFETQ5, Q6 and parallel N-channel switch MOSFETQ7, Q8 and an element constant is selected for MOSFETQ5–Q6 in such a way that they have a logic threshold voltage corresponding to the level of the input signal when the supply voltage Vcc is relatively as low as about 3 V.

Figure 14:
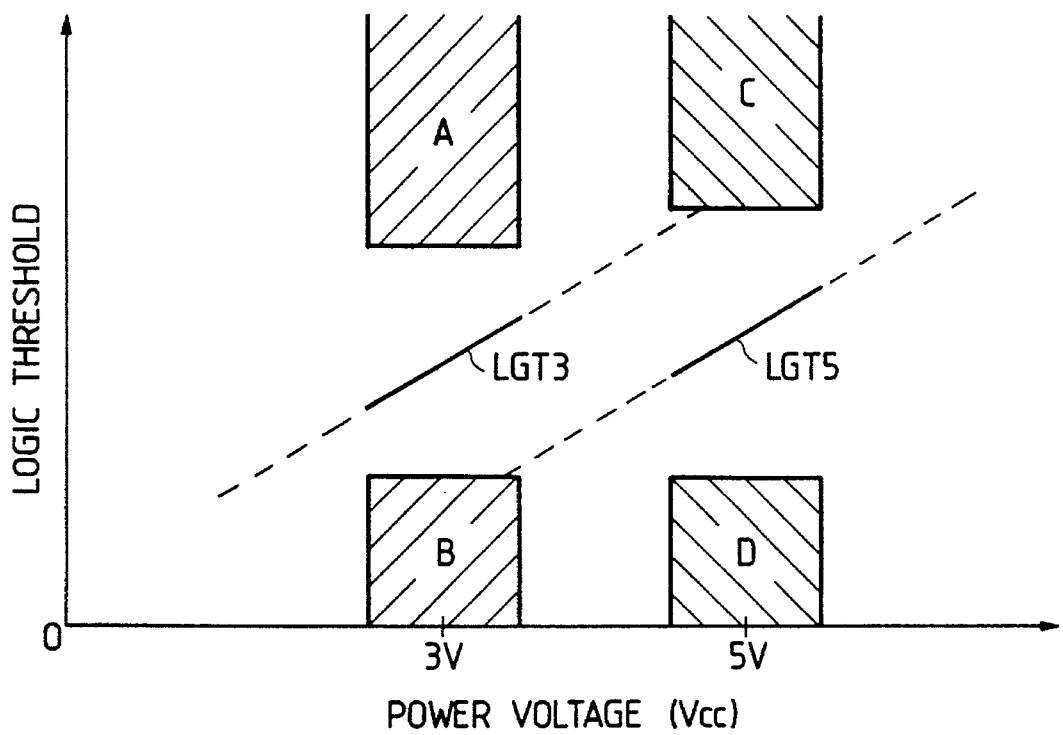
FIG. 14 is a characteristic drawing illustrating the relation between supply voltage and logic threshold voltage.

FIG. 14 shows the relation between the logic threshold voltage and the supply voltage Vcc. In FIG. 14, an area A (B) indicates what is seen to be logically at the high (low) level when the supply voltage Vcc is held at close to 3 V, whereas an area C (D) indicates what is seen to be logically at the high (low) level when the supply voltage Vcc is held at close to 5 V. In FIG. 14, further, LGT3 denotes a suitable logic threshold voltage when the supply voltage Vcc remains at 3 V, whereas LGT5 denotes a suitable logic threshold voltage when the supply voltage Vcc remains at 5 V. The logic threshold voltage of the logic circuit (e.g., an inverter) is caused to vary as the supply voltage Vcc varies. For instance, the logic circuit made to operated by the supply voltage Vcc at close to 3 V has the logic threshold voltage shown by LGT3 and when the supply voltage Vcc varies, the logic threshold voltage varies as shown by a broken line. Consequently, as shown in FIG. 14, a malfunction may occur when the logic circuit designed to operate by the supply voltage set at close to 3 V is operated by the supply voltage set at close to 5 V. This is also the case with the logic circuit designed to operate by the supply voltage set at close to 5 V when it is operated by the supply voltage set at close to 3 V.

For this reason, it has been arranged in this embodiment so that the logic threshold voltage of the input buffer varies from LGT3 (LGT5) TO LGT5 (LGT3) in proportion to the supply voltage. In other words, the logic threshold voltage of the input buffer IB1 is made to vary in accordance with LGT5 and the logic threshold voltage of the input buffer IB2 is made to vary in accordance with LGT3. The logic threshold voltage of the input buffer is determined by the threshold voltage, the channel length, the channel width and the like of each MOSFET as a component part. As set forth above, an input buffer corresponding to the supply voltage is obtained by selecting the constant of each of the elements constituting the input buffer (the threshold voltage, the channel length, the channel width and the like).

In the embodiment shown in FIG. 1, the operating voltage applied to each internal circuit is kept constant even though the supply voltage Vcc varies. Consequently, no malfunction occurs as noted above.

The decision signal Vch is supplied to not only the NAND gate circuit G2 but also the NAND gate circuit G1 via the inverter circuit N1. An internal chip enable signal ce formed according to an external chip enable signal $\overline{CE}$ is also supplied to the respective other inputs of these NAND gate circuits G1, G2. Consequently, the output signal of the NAND gate circuit G2 is set at the low level when the decision signal Vch is held at the high level in response to the state in which the memory is accessed by the enable signal ce at the high level while the supply voltage Vcc remains at relatively as high as about 5 V, whereby the input buffer IB1 is activated. In other words, the P-channel MOSFETQ1 of the input buffer IB1 is turned on and the N-channel MOSFETQ4 is turned off in response to the low lever of the output signal of the NAND gate circuit G2. An output signal is thus formed in accordance with the ON/OFF state of the input signals corresponding to the P-channel MOSFETQ2 and the N-channel MOSFETQ3 whose gates are coupled to the input terminal IN. In this way, the input signal supplied from the input terminal IN is retrieved via the input buffer IB1. In response to the high level of the decision signal Vch, the output signal of the NAND gate circuit G1 is set at the high level at this time. Consequently, the P-channel MOSFETQ5 of the input buffer IB2 is turned off, whereas the N-channel MOSFETQ8 thereof is turned on. The input buffer IB2 thus outputs a signal fixed to the low level, irrespective of the input signal from the terminal IN.

While the decision signal Vch is held at the low level in conformity with the fact that the supply voltage Vcc is held as relatively as low as about 3 V in the memory access state in which the internal chip enable signal ce is set at the high level, the output signal of the NAND gate circuit G1 instead of the NAND gate circuit G2 is set at the low level and the input buffer IB2 in place of the input buffer IB1 is activated. In other words, the P-channel MOSFETQ5 of the input buffer IB2 is turned on and the N-channel MOSFETQ8 is turned off in conformity with the low level of the output signal of the NAND gate circuit G1. An output signal is formed in conformity with the ON/OFF state of the P-channel MOSFETQ6 and the N-channel MOSFETQ7 whose gates are coupled to the input terminal IN. In this way, the input signal supplied from the input terminal IN is obtained via the input buffer IB2. At this time, the P-channel MOSFETQ1 of the input buffer IB1 is turned off, whereas N-channel MOSFETQ4 is turned on as the output signal of the NAND gate circuit G2 is set at the high level. Consequently, the input buffer IB1 outputs a signal fixed to the low level, irrespective of the input signal from the terminal IN.

There are provided output switch circuits SW1, SW2 for obtaining the output signal of the input buffer thus activated in conformity with the two input buffers IB1, IB2. The output switch circuits SW1, SW2 are in the form of a multiplexer combining CMOS switches having a tri-state output function. The output switch circuit SW1 corresponding to the input buffer IB1 is provided with a CMOS inverter circuit comprising a P-channel MOSFETQ10 and an N-channel MOSFETQ11 for receiving the output signal of the input buffer IB1, and a P-channel MOSFETQ9 and an N-channel MOSFETQ12 for supplying operating voltage to the CMOS inverter circuit. The decision signal Vch is inverted by the inverter circuit N2 before being supplied to the gate of P-channel MOSFETQ9, whereas it is directly supplied to the gate of the N-channel MOSFETQ12. The output switch circuit SW2 corresponding to the input buffer IB2 is also arranged likewise. However, the decision signals Vch in opposite combination are supplied to the P-channel MOSFET and the N-channel MOSFET for supplying operating voltage to the CMOS inverter circuit for receiving the output signal of the input buffer IB2. Moreover, the output terminals of the two output switch circuits SW1 and SW2 are commonly connected to an output terminal OUT.

When the decision signal Vch is held at the high level since the supply voltage Vcc is hold at relatively as high as about 5 V, the N-channel MOSFETQ12 of the output switch circuit SW1 and the P-channel MOSFETQ9 are turned on because of the low level of an inverter circuit N2. Further, the CMOS inverter circuit of the output switch circuit SW1 is set to operating conditions and the output signal of the input buffer IB1 activated then is output from the input buffer. In the other output switch circuit SW2, both of the P-channel MOSFET and the N-channel MOSFET are then turned off and set to an output high impedance state. Therefore, the external signal supplied from the input terminal IN is transmitted via the input buffer IB1 and the output switch circuit SW1 to the output terminal OUT and obtained by the internal circuit.

When the decision signal Vch is held at the low level since the supply voltage Vcc is held relatively as low as about 3 V, the N-channel MOSFETQ12 of the output switch circuit SW1 and the P-channel MOSFETQ9 are turned off because of the low level of the inverter circuit N1, and the similar switch MOSFETQ9 of the output switch circuit SW2 is turned off instead. Consequently, the output signal of the input buffer IB2 activated then is output via the output switch circuit SW2. In the output switch circuit SW1, both of the P-channel MOSFETQ9 and the N-channel MOSFETQ12. Therefore, the external signal supplied from the input terminal IN is transmitted via the input buffer IB2 and the output switch circuit SW2 to the output terminal OUT and obtained by the internal circuit.

When the input buffer shown in FIG. 10 is used for the address buffer, the input terminal IN is used as an external terminal for receiving the external address signal. Moreover, an inverter (not shown), for instance, is connected to the output terminal OUT and the internal address signal whose phase is inverted with respect to the external address signal is formed by the inverter. The internal address signal in phase with the external address signal is output from the output terminal OUT, whereas the internal address signal with the inverted phase is output from the inverter. Consequently, these internal address signals are supplied to the address decoder as a complementary address signal and used to select the memory cell. Needless to say, there are provided combinations of input buffers and inverters equivalent to the number of the external address signals.

When the input buffer is used as the data input buffer DIB, moreover, the input terminal IN is coupled to an external input/output terminal I/O and the output terminal OUT is coupled to a write circuit (not shown). The write circuit is supplied with the high voltage Vpp and when the writer operating mode is designated, supplies high or low voltage in conformity with the output signal from the output terminal OUT to the common data line CD.

With these two operating voltages restricted to about 5 V and 3 V for operating the internal circuit by means of the supply voltage supplied from the outside, two input buffers and two output switch circuits are simply provided to deal with the difference in level between the input signals supplied from the outside in conformity with the two operating voltages. This arrangement makes it possible to perform the write operation using the existing general purpose writer (programmer) and also to operate a system having operating voltage in either 5 V or 3 V series. As a result, a range of uses is extendable and mass producibility on the part of EPROM manufacturers, whereas users are allowed to use EPROM in any system of both 5 V and 3 V series. System designing is thus facilitated while the trouble of controlling assembly parts is obviated.

Even if, however, there arises a relatively great difference in the operating speed and power consumption of the internal circuit resulting from two operating voltages of about 5 V and 3 V, different specifications may be set up according to the operating voltage so as to compensate for the operating speed and power consumption at each operating voltage. EPROM may actually be treated in a different way which conforms to the individual specification when it is mounted in a 5 or 3 V system. The internal circuit can thus be prevented from being complicated by determining the operating speed and power consumption of one semiconductor integrated circuit in conformity with the individual operating voltage.

Figure 11:
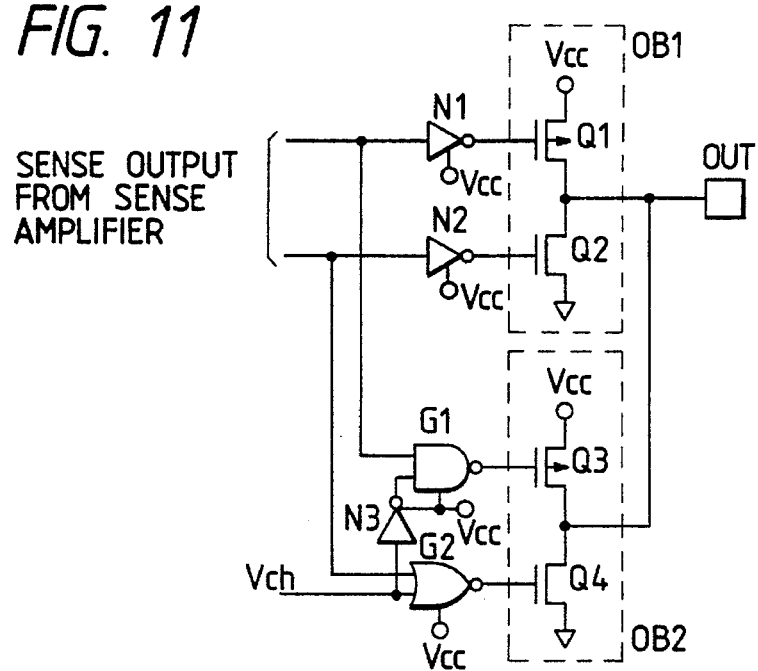
FIG. 11 is a specific circuit diagram of an output buffer for use in EPROM of FIG. 9.

FIG. 11 is a specific circuit diagram of part of an output buffer for sending out an output signal outside in the data output buffer.

In this embodiment, two output buffers OB1, OB2 are provided for the output terminal OUT. The output buffer OB1 always remains operational, irrespective of the voltage value of the supply voltage Vcc. In other words, the output signal of the sense amplifier is supplied via the CMOS inverter circuits N1, N2 constituting the driver to the gates of a P-channel output MOSFETQ1 and an N-channel output MOSFETQ2. 0n the other hand, an output buffer OB2 is activated when the supply voltage Vcc is set relatively as low as about 3 V. Since the output MOSFETQ1 and Q2 are supplied with sufficient drive voltage when the supply voltage Vcc is set relatively as high as about 5 V, a relatively large output current is obtainable. When the supply voltage Vcc is conversely reduced sharply by 40% to about 3 V, the output current is also decreased accordingly. As a result, there practically arises a difference in operating speed between cases where the 5-V system is operated and where the 3-V system is operated. Although it may be allowed to use EPROM different in specification as noted above with the difference in operating speed as it is, the auxiliary output buffer OB2 is activated in this embodiment to maintain the drive capability in order to make the operating speed substantially invariable.

Therefore, the output buffer OB2 has a tri-state output function. In other words, the gate of a P-channel output MOSFETQ3 is provided with an NAND gate circuit G1 as a drive circuit, whereas the gate of an N-channel output MOSFETQ4 is provided with a NOR gate circuit G2 as a drive circuit. The decision signal Vch is supplied to the control input of the NOR gate circuit G2 and the decision signal Vch is inverted by an inverter circuit N3 before being supplied to the NAND gate circuit G1. An sense output is supplied to the other inputs of the NAND gate circuit G1 and the NOR gate circuit G2.

While the supply voltage Vcc is held at the high level as the supply voltage Vcc is held as high as about 5 V, the output signals of the gate circuits G1, G2 are respectively at the high level and the low level, irrespective of the sense output. The output MOSFETQ3 and Q4 are simultaneously turned off and the load connected to the output terminal OUT is driven by only the output buffer OB1. When the decision signal Vch is set at the low level as the supply voltage Vcc is set as low as about 3 V, the gate circuits G1, G2 are opened and the P-channel output MOSFETQ3 and the N-channel output MOSFETQ4 are turned on/off in response to the sense output. In this case, the load connected to the output terminal OUT is driven by the output buffers OB1, OB2, whereby the fall of the load driving capability can be compensated for at the low voltage. The data output buffer DOB has, for instance, an inverter (not shown) in addition to the output buffer shown in FIG. 11. The input signal directed to the output buffer DOB of FIG. 9 is, for instance, directly supplied to the inverter N1 and the gate G1 and via the inverter (not shown) to the inverter N1 and the gate G2. Moreover, the output terminal OUT is connected to the external input/output terminal I/O.

The input buffer of FIG. 10 may be used for the input buffers of the address buffers XADB, YADB and the like shown in the embodiment of FIG. 1. In this case, the supply voltage Vcc supplied from the outside, in place of the internal constant voltage Vcv, is directly used as far as the input buffers of the address buffers XADB, YADB and the like are concerned. When the internal constant voltage Vcv is used for the internal circuits including the input buffers of the address buffers XADB, YADB and the like as shown in the embodiment of FIG. 1, is possible to obtain the input signal by means of the same logic threshold voltage. For instance, the TTL (Transistor Transistor Logic) level is normally input in the 5-V system, whereas the CMOS level is normally input in the 3-V system. The input interface like this is most practical and a CMOS inverter circuit having an intermediate level satisfying both systems can simply be formed.

Figure 12:
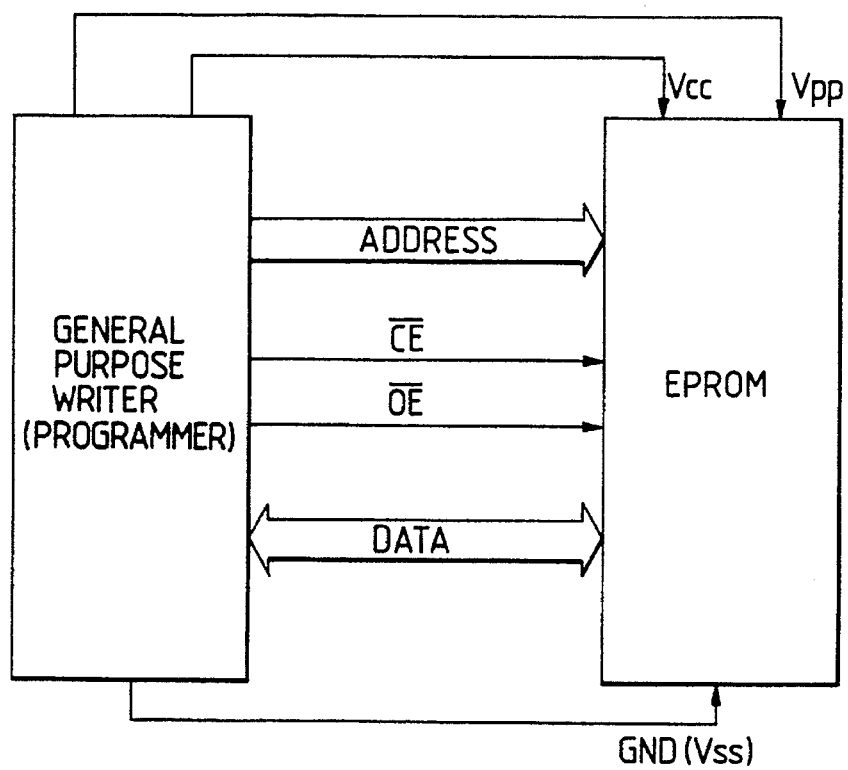
FIG. 12 is a block diagram showing the relation between a writer and EPROM.

FIG. 12 is a block diagram showing the relation between a programmer and EPROM.

When the programmer is an existing general purpose writer, the supply voltage Vcc supplied to EPROM is relatively as high as 5 V or 6 V and the high voltage VPP at about 12 V is also supplied to EPROM at the time of writing (programming). Address signals of X and Y series are supplied via address signal lines ADDRES to address terminals. Write data and read data for verification are exchanged via data lines. When data is written/read with 8 bits as a unit, 8 data lines are arranged. A ground potential line GND is used to connect the ground potential Vss of the programmer to the ground terminal of EPROM.

Figure 13:
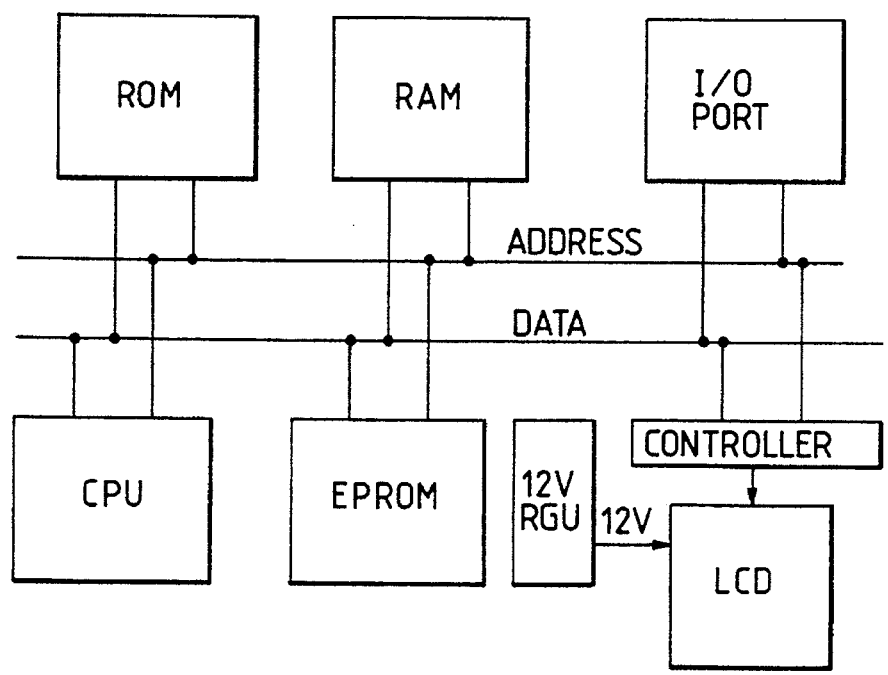
FIG. 13 is a block diagram showing a microcomputer system in which EPROM according to the present invention is mounted.

FIG. 13 is a block diagram showing a microcomputer system in which EPROM according to the present invention is mounted.

In this microcomputer system of this embodiment, ROM (Read Only Memory) stored with programs and the like, RAM (Random Access Memory) for use as a main memory unit, an input/output port I/O PORT, EPROM according to the present invention, and a liquid crystal display unit as a monitor connected via a control circuit CONTROLLER, these being mutually connected via an address bus ADDRESS, a data bus DATA and a control bus (not shown) with a microprocessor CPU as a central unit. There is also provided a power supply RGU of 12 V series necessary for the operation of the display unit LCD in this embodiment. This high voltage is utilized to write data to EPROM. In this embodiment, a decoder for forming the external chip enable signal $\overline{CE}$ is provided for use when an address signal on the address bus ADDRESS is decoded and transmitted from CPU to indicate the address space allotted to EPROM.

EPROM may be mounted in this microcomputer system likewise even though it is used at a high voltage of 5 V or a low voltage of 3 V. Particularly when it is intended to decrease power consumption or to furnish a lap-top system or a so-called palm-top electronic note, the operation of such a system at a low voltage of 3 V is advantageous. Even when EPROM is mounted in a low-voltage system, the conventional general purpose writer may be used to write data.

The functions and effects achievable in the foregoing embodiments are as follows:

(1) When the internal circuit is so arranged as to make it operate by restricting the operating voltage supplied from the outside to what has a predetermined allowable range of relatively high voltages and to what has a predetermined allowable range of relatively low voltages, an uncomplicated means for the operation of the internal circuit at the fixed voltage on the low voltage side or for making an input/output interface correspond to two of the operating voltages can implement the purpose noted earlier with the effect of making it possible to obtain a semiconductor integrated circuit having a wide range of uses.

(2) The voltage switching circuit is so controlled at the time the supply voltage supplied by the supply voltage decision circuit is a relatively low operating voltage as to switch the operating voltage formed by the constant supply voltage circuit to the relatively low operating voltage supplied from the outside for use, whereby the supply voltage supplied from the outside is effectively utilized with the effect of making it possible to obtain a semiconductor integrated circuit relatively simple in configuration and capable of operating at two widely different supply voltages of about 5 V and 3 V.

(3) Two input circuits are provided as those for receiving the input signal supplied from the outside, one having the logic threshold voltage corresponding to the input signal when the operating voltage is relatively high, the other having the logic threshold voltage corresponding to the input signal when the operating voltage is relatively low, to make effective the operation of one of the input circuits corresponding to the decision made on the supply voltage supplied from the outside with the effect of making it possible to obtain a semiconductor integrated circuit relatively simple in configuration and capable of operating at two widely different supply voltages of about 5 V and 3 V.

(4) Two output circuits are provided as those for transmitting the output signal to the external terminal, one constantly operating and corresponding to the output drive capability when the operating voltage is relatively high, the other making up for the shortage of the drive capability of the output signal when the operating voltage is relatively low with the effect of compensating for the operating speed at the low operating voltage by operating the two output circuits when the operating voltage is low.

(5) A nonvolatile memory cell as the internal circuit having the gate structure having two layers of floating and control gates allows the existing general purpose writer or programmer to write data with the effect of making it possible to read data in a high voltage system at about 5 V and a low voltage system at about 3 V both.

(6) As the sense circuit for receiving the amplified output signal of the initial-stage amplifier circuit for amplifying the signal read from the memory cell in the circuit provided with the nonvolatile memory cell of (5), what has the logic threshold voltage corresponding to the read signal when the operating voltage is relatively high and what has the logic threshold voltage corresponding to the read signal when the operating voltage is relatively low are formed to make effective the operation of one sense circuit corresponding to the supply voltage decision signal with the effect of making it possible to obtain EPROM relatively simple in configuration and allowing data to be read in a high voltage system at about 5 V and a low voltage system at about 3 V both.

(7) By adopting a method of setting the operating conditions of the internal circuit arranged in a semiconductor integrated circuit in such a way as to make the operating conditions correspond individually to the operating voltage supplied from the outside in a predetermined allowable range of relatively high voltages and in a predetermined allowable range of relatively low voltages both, an uncomplicated means for the operation of the internal circuit at the fixed voltage on the low voltage side or for making an input/output interface correspond to two of the operating voltages can implement the purpose noted earlier with the effect of making it possible to obtain a semiconductor integrated circuit that can be operated selectively at both of the operating voltages.

(8) By adopting a method of converting the relatively high supply voltage supplied from the outside to low operating voltage by means of the internal constant supply voltage circuit and of switching the low operating voltage to the relatively low operating voltage supplied from the outside in place of the voltage formed by the constant supply voltage circuit so as to operate the internal circuit, the supply voltage supplied from the outside is effectively utilized with the effect of making it possible to obtain a semiconductor integrated circuit relatively simple in configuration and capable of operating at two widely different supply voltages of about 5 V and 3 V.

Although the invention made by the present inventors has been described by reference to the specific embodiments above, the present invention thus applied therefor is not limited to the embodiments enumerated above and may needless to say be subjected to various modifications without departing the scope and the spirit of the invention. For instance, the erasure of the memory array may be made electrically. More specifically, a so-called collective erasure EEPROM may be used to draw the charge accumulated in the floating gate to the source side, the drain side or the substrate or well side by utilizing the tunnel current. In this case, EEPROM as mounted int the system shown in FIG. 13 may be used for write/erasure. Moreover, the internal circuit may be a static RAM, a dynamic RAM, a CMOS logic circuit, a microprocessor or any one of the peripheral circuits of them in addition to EPROM, the collective erasure EEPROM. In such an internal circuit, the restriction imposed on the operating voltage may be obviated by using the general purpose EPROM like EPROM. Notwithstanding, use may be made of a semiconductor integrated circuit that can be mounted in not only the conventional 5-V system but also a system whose operating voltage is as low as 3 V. In this way, a semiconductor integrated circuit is obtainable in that it can operate correspondingly even when the operating voltage is altered because of the extension or modification of the system.

The specific arrangement of not only the voltage conversion circuit but also the reference voltage generating circuit, the voltage follower, the supply switch or the like may be implemented in various forms. The operating voltage on the low voltage side includes a ±10% allowable range centering on about 2.5 V or 2 Vin addition to about 3 V and may include a predetermined relatively wide allowable range of about 3 V–2 V, for instance. In other words, the CMOS level is the most practical signal level for use in the low voltage system and the allowable voltage range can be set wide as noted above since at the CMOS level, the logic threshold voltage of the interface circuit connected to the internal circuit and the external terminal varies with the variation of the supply voltage. When the allowable range of the operating voltage is widened, the corresponding power consumption and the operating speed may also be considered swollen, respectively. However, this problem can be solved by setting the specification corresponding to the operating voltage. In other words, the system may be used in such a way as to conform to the operating voltage of the system in which EPROM is mounted as specified.

The effect of the representative embodiment of the present invention will briefly be described. The internal circuit of the semiconductor integrated circuit can be made to operate at the relatively high operating voltage which is supplied from the outside and has a predetermined relatively high operating voltage range and at the relatively low operating voltage having a predetermined relatively low operating voltage range. With this arrangement, it can simplifies the configuration of the internal circuit which can be operated in response to the two kinds of operating voltages. A semiconductor integrated circuit usable in not only the conventional system but also a low-voltage system can be obtained. The use of a semiconductor integrated circuit can be extended by adopting the method of restricting the operating voltage to two; that is, a high and a low system operating voltage. Moreover, a range os uses of such a semiconductor integrated circuit simple in configuration can be attempted by employing the method of making the individual specification adaptable to each system voltage.

What is claimed is:

1. A nonvolatile memory device formed on a semiconductor substrate comprising:

an external supply voltage terminal which receives a supply voltage;

a supply voltage decision circuit which decides whether or not a value of the supply voltage supplied via said external supply voltage terminal achieves a predetermined value;

a plurality of nonvolatile memory cells;

a sense amplifier which amplifies a signal from one of the plurality of nonvolatile memory cells;

an external output terminal; and an output circuit which is coupled between the sense amplifier and the external output terminal and is coupled to the supply voltage decision circuit, which has a first logic threshold voltage and a second logic threshold voltage being lower than the first logic threshold voltage, which judges data to be outputted, from the amplified signal from the sense amplifier, by using the first logic threshold voltage if the supply voltage decision circuit indicates that the value of the supply voltage achieves the predetermined value, and which judges data to be outputted, from the amplified signal from the sense amplifier, by using the second logic threshold voltage if the supply voltage decision circuit indicates that the value of the supply voltage does not achieve the predetermined value.

2. A nonvolatile memory device according to claim 1, wherein the sense amplifier is coupled to the external supply voltage terminal so that the sense amplifier operates under the supply voltage via the external supply voltage terminal.

3. A nonvolatile memory device according to claim 2, wherein the output circuit includes:

a first circuit coupled to the sense amplifier and having the first logic threshold voltage;

a second circuit coupled to the sense amplifier and having the second logic threshold voltage;

a selection circuit selecting one of the first circuit and the second circuit in response to a decision from the supply voltage decision circuit; and a buffer coupled to the external output terminal and to the selected one of the first circuit and the second circuit.

4. A nonvolatile memory device according to claim 3, wherein the selection circuit selects one of an output from the first circuit and an output from the second circuit.

5. A nonvolatile memory device according to claim 4, wherein each of the first circuit, the second circuit and the selection circuit is coupled to the external supply voltage terminal so that each of the first circuit, the second circuit and the selection circuit operates under the supply voltage via the external supply voltage terminal.

6. A nonvolatile memory device according to claim 1, further comprising:

an external input terminal to which an input signal to be supplied to a nonvolatile memory cell among the plurality of nonvolatile memory cells is supplied; and an input circuit which is coupled between said external input terminal and the nonvolatile memory cell and to said supply voltage decision circuit; which has a first logic threshold voltage and a second logic threshold voltage being lower than the first logic threshold voltage, which judges data to be written to the nonvolatile memory cell, from the input signal, by using the first logic threshold voltage if the supply voltage decision circuit indicates decision that the value of the supply voltage achieves the predetermined value, and which judges data to be written to the nonvolatile memory cell, from the input signal, by using the second logic threshold voltage if the supply voltage decision circuit indicates decision that the value of the supply voltage does not achieve the predetermined value.

7. A nonvolatile memory device according to claim 6, wherein the input circuit includes:

a first input circuit coupled to the external input terminal and having the first logic threshold voltage;

a second input circuit coupled to the external input terminal and having the second logic threshold voltage; and a selection circuit selecting one of an output from the first input circuit and an output from the second input circuit in response to the decision from the supply voltage decision circuit.

8. A nonvolatile memory device according to claim 7, wherein the first input circuit represents the first logic threshold voltage in response to the decision that the value of the supply voltage achieves the predetermined value and wherein the second input circuit represents the second logic threshold voltage in response to the decision that the value of the supply voltage does not achieve the predetermined value.

9. A nonvolatile memory device according to claim 6, wherein the external input terminal is used as the external output terminal.

10. A nonvolatile memory device according to claim 6, wherein the output circuit includes a compensation circuit compensating an output current to be supplied to the external output terminal when the supply voltage decision circuit indicates that the value of the supply voltage does not achieve the predetermined value.

11. A nonvolatile memory device according to claim 10, wherein the output circuit includes:

a first output circuit coupled between the sense amplifier and the external output terminal; and a second output circuit coupled between the sense amplifier and the external output terminal as the compensation circuit, wherein the second output circuit operates in response to decision that the value of the supply voltage does not achieve the predetermined value.

12. A nonvolatile memory device according to claim 1, wherein the output circuit includes a compensation circuit compensating an output current to be supplied to the external output terminal when the supply voltage decision circuit indicates that the value of the supply voltage does not achieve the predetermined value.

13. A nonvolatile memory device according to claim 12, wherein the output circuit includes:

a first output circuit coupled between the sense amplifier and the external output terminal; and a second output circuit coupled between the sense amplifier and the external output terminal as the compensation circuit, wherein the second output circuit operates in response to decision that the value of the supply voltage does not achieve the predetermined value.

14. A nonvolatile memory device formed on a semiconductor substrate comprising:

a plurality of nonvolatile memory cells;

an external supply voltage terminal which receives a supply voltage;

a supply voltage decision circuit which decides whether or not a value of the supply voltage supplied via said external supply voltage terminal achieves a predetermined value;

an external input terminal to which an input signal to be supplied to a nonvolatile memory cell among the plurality of nonvolatile memory cells is supplied; and an input circuit which is coupled between said external input terminal and the nonvolatile memory cell and to said supply voltage decision circuit, which has a first logic threshold voltage and a second logic threshold voltage being lower than the first logic threshold voltage, which judges data to be written to the nonvolatile memory cell, from the input signal, by using the first logic threshold voltage if the supply voltage decision circuit indicates decision that the value of the supply voltage achieves the predetermined value, and which judges data to be written to the nonvolatile memory cell, from the input signal, by using the second logic threshold voltage if the supply voltage decision circuit indicates decision that the value of the supply voltage does not achieve the predetermined value.

15. A nonvolatile memory device according to claim 14, wherein the input circuit includes:

a first input circuit coupled to the external input terminal and having the first logic threshold voltage;

a second input circuit coupled to the external input terminal and having the second logic threshold voltage; and a selection circuit selecting one of an output from the first input circuit and an output from the second input circuit in response to the decision from the supply voltage decision circuit.

16. A nonvolatile memory device according to claim 15, wherein the first input circuit represents the first logic threshold voltage in response to the decision that the value of the supply voltage achieves the predetermined value and wherein the second input circuit represents the second logic threshold voltage in response to the decision that the value of the supply voltage does not achieve the predetermined value.

17. A nonvolatile memory device according to claim 14, further comprising:

an external output terminal; and an output circuit which provides data from a nonvolatile memory cell to the external output terminal and which includes a compensation circuit compensating an output current to be supplied to the external output terminal when the supply voltage decision circuit indicates that the value of the supply voltage does not achieve the predetermined value.

18. A nonvolatile memory device according to claim 17, wherein the output circuit includes:

a first output circuit coupled between the sense amplifier and the external output terminal; and a second output circuit coupled between the sense amplifier and the external output terminal as the compensation circuit, the second output circuit operates in response to the decision that the value of the supply voltages does not achieve the predetermined value.

19. A nonvolatile memory device according to claim 18, wherein the external input terminal is used as the external output terminal.

20. A nonvolatile memory device according to claim 18, wherein the first logic threshold voltage and the second logic threshold voltage have values independent from the supply voltage.

21. A nonvolatile memory device formed on a semiconductor substrate comprising:

an external supply voltage terminal which receives a supply voltage;

a supply voltage decision circuit which decides whether or not a value of the supply voltage supplied via said external supply voltage terminal achieves a predetermined value;

a plurality of nonvolatile memory cells;

a sense amplifier which amplifies a signal from one of the plurality of nonvolatile memory cells;

an external output terminal; and an output circuit which is coupled between the sense amplifier and the external output terminal and is coupled to the supply voltage decision circuit, and which has a compensation circuit compensating an output current to be supplied to the external output terminal when the supply voltage decision circuit indicates that the value of the supply voltage does not achieve the predetermined value.

22. A nonvolatile memory device according to claim 21, wherein the output circuit includes:

a first output circuit coupled between the sense amplifier and the external output terminal; and a second output circuit coupled between the sense amplifier and the external output terminal as the compensation circuit, wherein the second output circuit operates in response to decision that the value of the supply voltage does not achieve the predetermined value.

* * * * *